(12) United States Patent
Chen et al.

(10) Patent No.: US 6,521,475 B1
(45) Date of Patent: Feb. 18, 2003

(54) METHOD OF FABRICATING A LIQUID CRYSTAL-ON-SILICON BACKPLANE

(75) Inventors: Tien-Hsiung Chen, Tao-Yuan Hsien (TW); Wei-Shaiu Chen, Chin-Men Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/683,340

(22) Filed: Dec. 17, 2001

(51) Int. Cl.[7] .............................................. H01L 21/00
(52) U.S. Cl. ............................ 438/34; 438/30; 349/139
(58) Field of Search ................................. 257/680, 678, 257/698; 349/139, 153–157; 359/290; 438/22, 25, 30, 34, 149, 384, 28

(56) References Cited

U.S. PATENT DOCUMENTS 4,653,864 A * 3/1987 Baron et al. ................. 350/344
6,008,876 A * 12/1999 Moore .......................... 349/139
6,153,927 A * 11/2000 Raj et al. ...................... 257/680
6,307,612 B1 * 10/2001 Smith et al. .................. 349/157
6,381,061 B2 * 4/2002 Levolta ........................ 359/291

* cited by examiner

Primary Examiner—Matthew Smith
Assistant Examiner—Calvin Lee
(74) Attorney, Agent, or Firm—Winston Hsu

(57) ABSTRACT

A reflective mirror layer is formed over a silicon substrate and is then selectively etched to define a crossover pad region, a pixel array region, and a bonding pad region on the silicon substrate. A dielectric layer is deposited over the crossover pad region, the pixel array region and the bonding pad region, and a plurality of crossover pad vias are formed within the crossover pad region thereafter. By filling the crossover pad vias with conductive material, a plurality of plugs is formed in the plurality of the vias. Then, a top pad, electrically coupled to the bottom pad via the plugs, is formed over the crossover pad region. A spacer pattern on the dielectric layer within the pixel array region is defined thereafter. Finally, the dielectric layer is etched to form a plurality of spacers within the pixel array region.

11 Claims, 4 Drawing Sheets

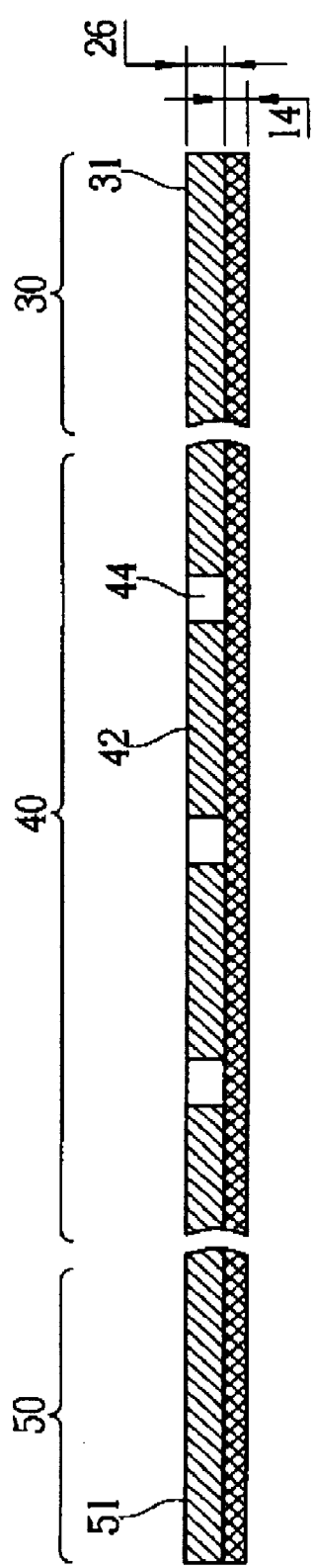
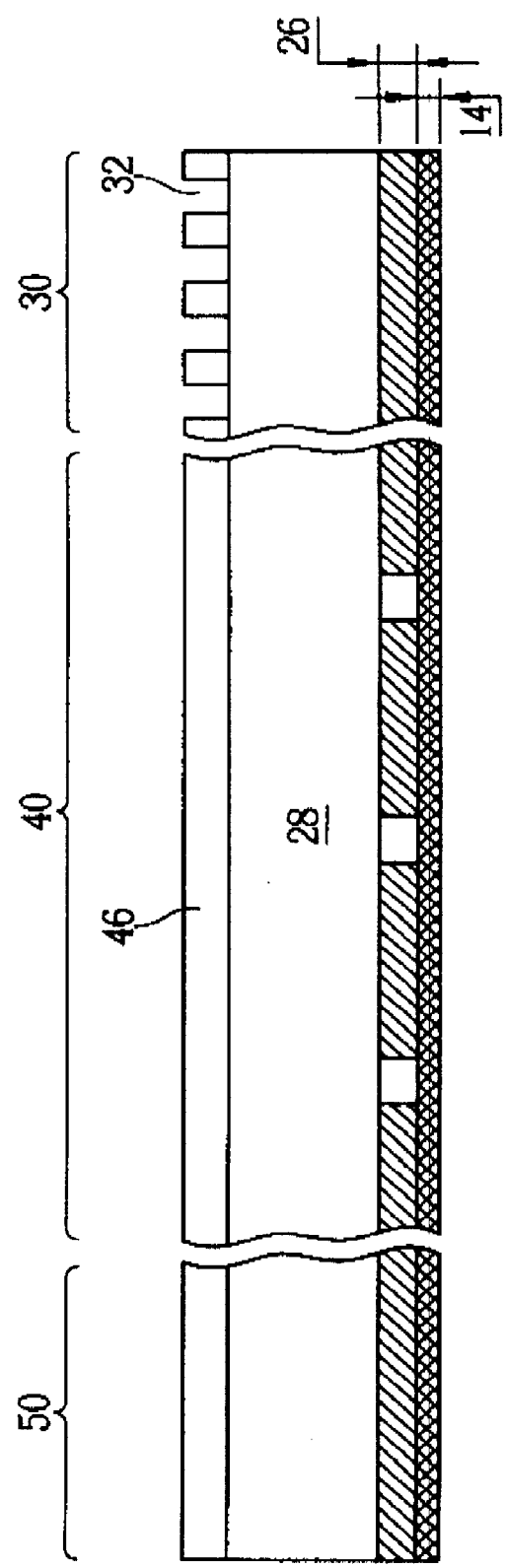
Fig. 2A
Fig. 2B

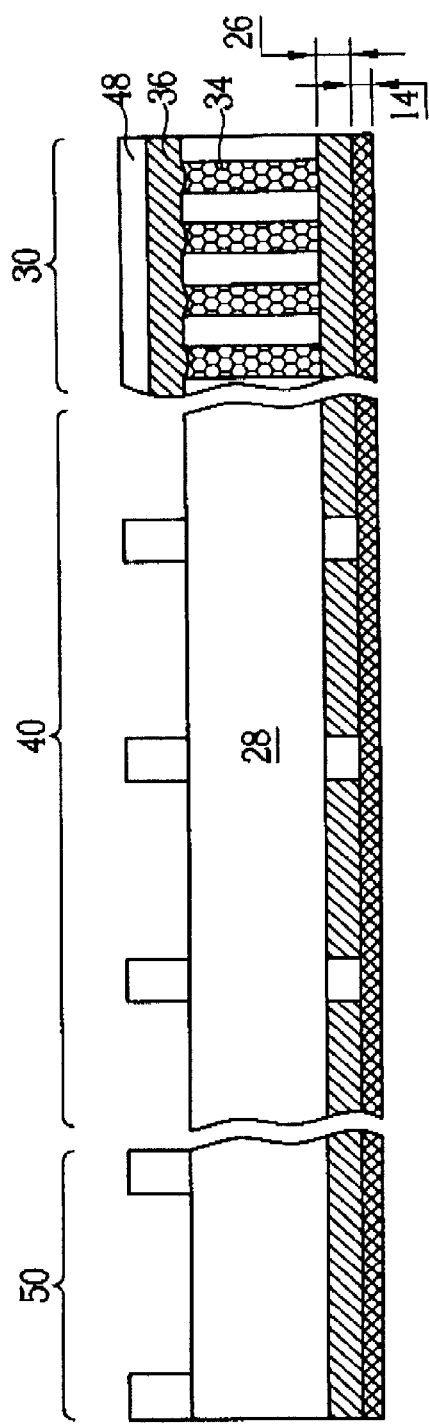
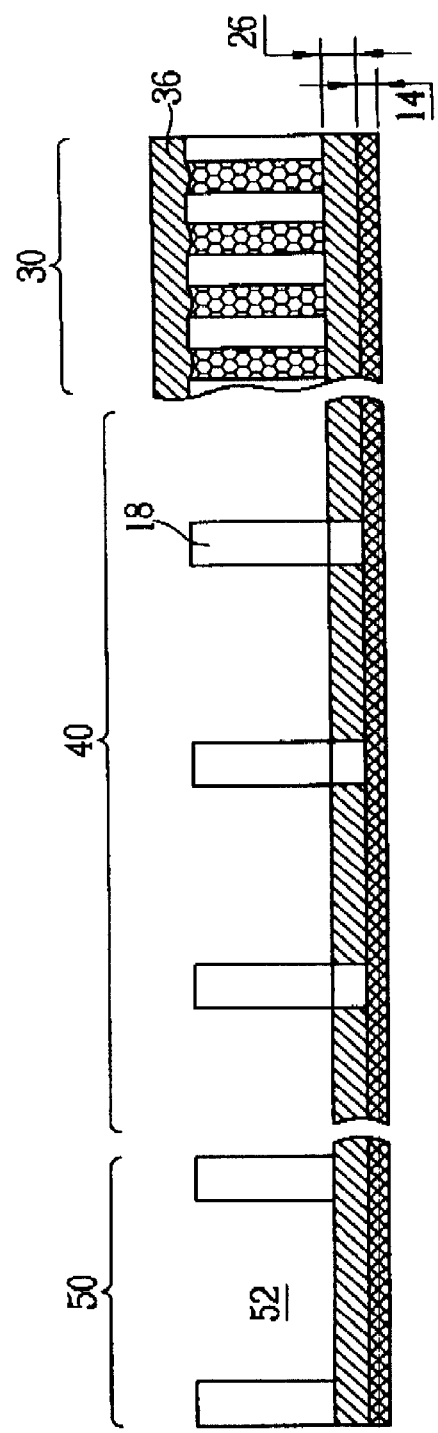
Fig. 2E
Fig. 2F

METHOD OF FABRICATING A LIQUID CRYSTAL-ON-SILICON BACKPLANE

BACKGROUND OF INVENTION

1. Field of the Invention

The present invention relates to a method of fabricating a Liquid Crystal-on-Silicon (LCoS) backplane, and more particularly, to a method of fabricating spacers and crossover pads of the LCos backplane together.

2. Description of the Prior Art

Liquid Crystal-on-Silicon micro-display technology is the key of reflective LCoS projectors and rear-projection televisions. The advantage of LCoS micro-displays is tiny, high resolution, low power, low cost, etc. The difference between a LCoS micro-display and a conventional thin film transistor-liquid crystal display (TFT-LCD) is materials used for forming substrates. Both of a cover and a backplane are made of glass in a TFT-LCD, nevertheless, the cover in a LCoS display is made of glass, but the backplane in a LCoS display is a semiconductor silicon substrate. Therefore, a LCoS process combines LCD techniques and complementary metal-oxide semiconductor (CMOS) processes. Micro-display technologies nowadays can roughly be divided into two types: transmissive and reflective.

In LCD devices, the thickness of the liquid crystal layer, or the cell gap (i.e., the spacing between a transparent conducting substrate and a semiconductor substrate) has to be precisely controlled to a specific value so as to ensure the performance of the display. In order to maintain the cell gap, in conventionally-employed liquid crystal display devices, plastic beads, glass beads or glass fibers are normally interposed between two liquid crystal display substrates and used as spacers. Thus, this cell gap is defined by the spacer height. In a conventional LCD process, the spacers are positioned by spraying, so the positions between the two liquid crystal display substrates cannot be controlled accurately. Consequently, the display performance of the liquid crystal display device is affected due to light scattering by the spacers that are present in the light transmitting regions. Furthermore, the spacers tend to be poorly distributed so that the display performance in portions of the LCD with spacers bunched is impaired, and the uniformity of the cell gap cannot be precisely maintained. Moreover, the quality of the displays in the same batch or in different batches is different, leading to a reduced yield rate and an increased manufacturing cost.

In addition, size and cost restraints for micro-displays normally require the drive circuit of an integrated circuit to be integrated into the backplane along with the pixel transistors. In other words, the drive circuit is fabricated on the display substrate, rather than designed as a large external drive circuit of the conventional LCD devices. In the conventional technique, process of forming the drive circuit is implemented after positioning the spacers. Then, the electrode of the upper transparent conducting substrate is soldered to the internal circuit board during the backend assembly process.

Since the bead-spacers are sprayed on the LCD substrate in the conventional method, the locations of the spacers are unfixed and thus with irregular distribution that frequently leads to defects of the LCD devices. Therefore, methods for not only evenly spreading the spacers on the LCD substrate but also obtaining LCD devices with stable display performance are needed. Additionally, integrating mature CMOS processes with the LCDtechnology can effectively increase the production yield and reduce the production cost.

SUMMARY OF INVENTION

It is therefore a primary objective of the present invention to provide a method of fabricating a Liquid Crystal-on-Silicon backplane to solve the above-mentioned problem.

According to the claimed invention, a reflective mirror layer is formed on a silicon substrate and is then selectively etched to define a crossover pad region, a pixel array region, and a bonding pad region on the silicon substrate. The crossover pad region further comprises a bottom pad made from the reflective mirror layer, the pixel array region further comprises a plurality of reflection units made from the reflective mirror layer and a plurality of trenches formed between the reflection units, and the bonding pad region further comprises at least one bonding pad made from the reflective mirror layer. Then the trenches are filled with a gap-filling material, and a dielectric layer is deposited over the crossover pad region, the pixel array region and the bonding pad region. Thereafter, a first photoresist layer, comprising a plurality of openings for defining a crossover pad via pattern within the crossover pad region, is formed on the dielectric layer, and an etching process is performed to etch away exposed portions of the dielectric layer through the plurality of openings to form a plurality of crossover pad vias within the crossover pad region. The first photoresist layer is stripped then, and the crossover pad vias are filled with conductive material to form a plurality of plugs in the plurality of vias. A top pad electrically coupled to the bottom pad via the plugs is formed on the crossover pad region thereafter. Finally, a second photoresist layer is formed on the silicon substrate to mask the crossover pad region and to define a spacer pattern on the dielectric layer within the pixel array region, and then the dielectric layer is etched to form a plurality of spacers within the pixel array region.

It is an advantage of the present invention method that the post-spacers with fixed locations and a fixed height are formed by photolithography and etching processes, so that problems encountered in the prior art such as the irregular distribution of the bead-spacers are effectively prevented during the fabrication of LCoS micro-displays with the precisely-controlled cell gap. In addition, since the post-spacers and crossover pads, providing an internal circuit in a LCoS backplane, are fabricated together according to, subsequent processes for soldering the electrode of the upper transparent conducting substrate onto the internal circuit board are omitted. Consequently, the yield rate is increased and the production cost is reduced both due to the improved manufacturing processes.

These and other objectives of the present invention will no doubt become obvious to those of ordinary skill in the art after reading the following detailed description of the preferred embodiment that is illustrated in the various figures and drawings.

BRIEF DESCRIPTION OF DRAWINGS

FIG. 2A to FIG. 2F are cross-sectional diagrams of fabricating a Liquid Crystal-on-Silicon backplane according to the present invention.

DETAILED DESCRIPTION

Figure 1:
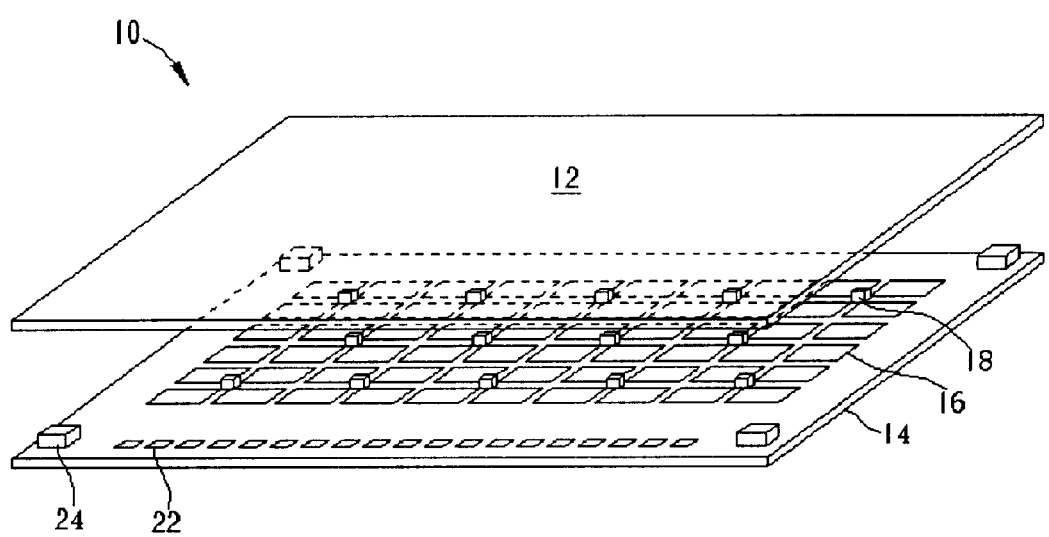
FIG. 1 is a schematic diagram of a LCoS micro-display product backend structure according to the present invention.

Please refer to FIG. 1 of a schematic diagram of a Liquid Crystal-on-Silicon (LCoS) micro-display product backend structure 10 according to the present invention. As shown in FIG. 1, a LCoS micro-display comprises a transparent conducting substrate 12, composed of indium tin oxide (ITO) glass and used as a cover, and a silicon substrate 14 used as a backplane. The LCoS micro-display further comprises a plurality of pixel arrays 16 formed on the backplane, and a plurality of post-spacers 18 formed on portions of the backplane without the pixel arrays. In addition, a plurality of bonding pads 22 formed on the edges of the backplane are used for soldering up the backplane and the cover in subsequent processes, and a plurality of crossover pads 24 formed on the corners are used to provide an internal circuit to electrically connect the backplane with a common electrode of the cover (not shown).

Figure 2C:
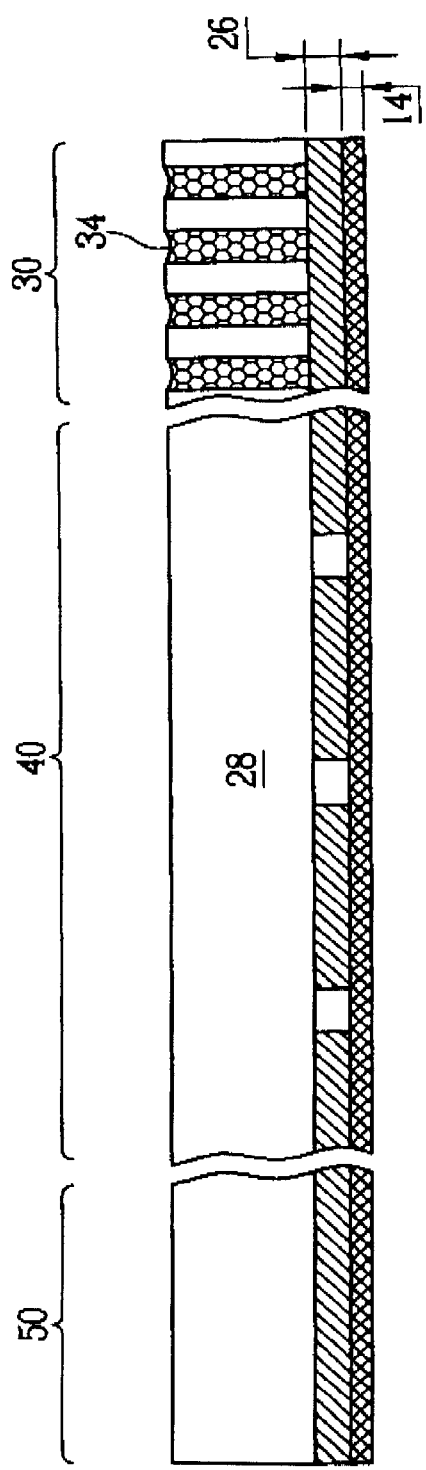

Please refer to FIG. 2A to FIG. 2F are cross-sectional diagrams of fabricating a Liquid Crystal-on-silicon backplane on a silicon substrate 14 according to the present invention. As shown in FIG. 2A, a reflective mirror layer 26 is formed over a silicon substrate 14. In a preferred embodiment of the present invention, the reflective mirror layer 26 is a reflective aluminum layer and is alternatively composed of other materials, such as gold or silver, that are capable of reflecting sufficient undiffused light to form a virtual image so as to correctly and clearly reflect a picture. In addition, after forming the reflective mirror layer 26, a reflectance enhancement passivation layer (not shown) is optionally integrated on the reflective mirror layer 26 to counteract inhibiting effect caused by the silicon substrate on reflectivity and improve the reflectance of the reflective mirror layer 26.

As shown in FIG. 2A, the reflective mirror layer 26 is selectively etched to define a crossover pad region 30, a pixel array region 40, and a bonding pad region 50 on the silicon substrate 14. Wherein the crossover pad region 30 comprises a bottom pad 31 made from the reflective mirror layer 26, the pixel array region 40 comprises a plurality of reflection units 42 made from the reflective mirror layer 26 and a plurality of trenches 44 formed between the reflection units 42, and the bonding pad region 50 comprises at least one bonding pad 51 made from the reflective mirror layer 26. Then, the trenches 44 are filled with a gap-filling material.

As shown in FIG. 2B, a dielectric layer 28 is deposited on the crossover pad region 30, the pixel array region 40 and the bonding pad region 50. In a preferred embodiment of the present invention, the dielectric layer 28 comprises silicon oxide. Thereafter, a first photoresist layer 46, comprising a plurality of openings 32 that defines a crossover pad via pattern within the crossover pad region 30, is formed on the dielectric layer 28.

As shown in FIG. 2C, an etching process is then performed to etch away exposed portions of the dielectric layer 28 through the plurality of openings 32 to form a plurality of crossover pad vias within the crossover pad region 30, and the first photoresist layer 46 is stripped thereafter. By filling the crossover pad vias with conductive material, a plurality of plugs 34 is formed in the plurality of the crossover pad vias. In the preferred embodiment of the present invention, the conductive material used for forming the plugs 34 is tungsten or other metal.

Figure 2D:
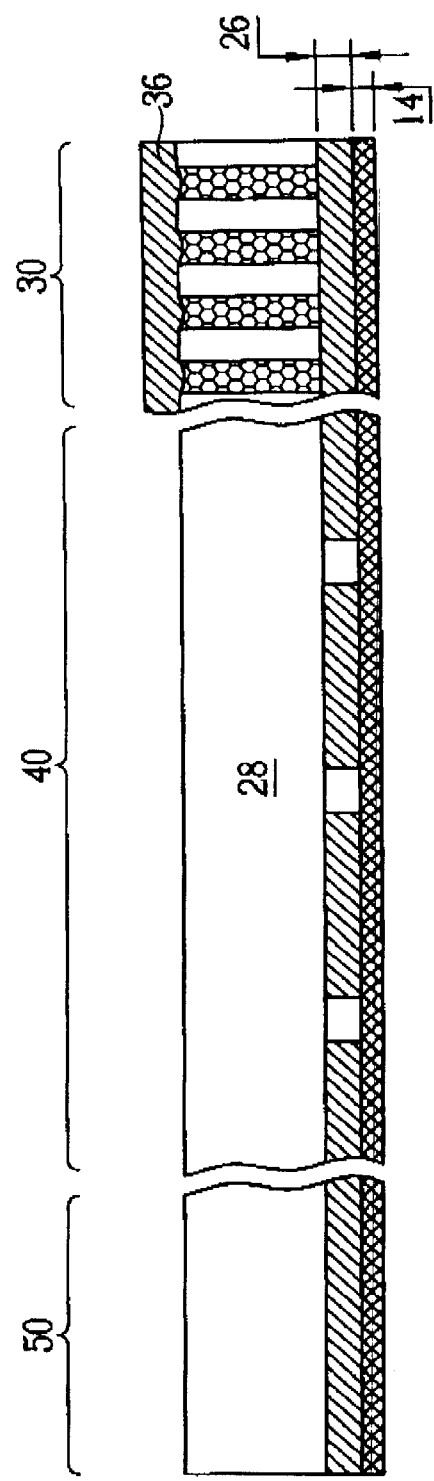

As shown in FIG. 2D, a top pad 36, having a top surface slightly higher than an uppermost surface of the plurality of spacers and being electrically coupled to the bottom pad 31 via the plugs 34, is then formed on the crossover pad region 30. Since the crossover pad is employed as an electric path connecting the silicon substrate 14 with the transparent conducting substrate 12 (shown in FIG. 1), the top surface of the crossover pad is slightly higher than the uppermost surface of the spacers to ensure that the crossover pad is electrically connected to the transparent conducting substrate 12 properly. In the preferred embodiment of the present invention, the top pad 36 is made of aluminum or other conductive material, such as metal, and is formed by a sputtering process.

As shown in FIG. 2E, a second photoresist layer 48 is formed on the silicon substrate 14 to mask the crossover pad region 30 and to define a spacer pattern on portions of the dielectric layer 28 within the pixel array region 40. As shown in FIG. 2F, the dielectric layer 28 is etched thereafter to form a plurality of post-spacers 18 within the pixel array region 40. Simultaneously, a plurality of openings 52 exposing a portion of the bonding pad is optionally formed within the bonding pad region 50 to solder to the bonding pad, depending on whether the passivation is required. Finally, after forming the plurality of post-spacers 18, the transparent conductive plate 12 is covered over the silicon substrate 14 electrically connected to the top pad 36 within the crossover pad region 30 at the end of the method.

In typical LCD devices, spacers are dispersed randomly on the entire silicon substrate, even in the viewing area. However, spacers in the viewing area of a display frequently lead to the reduced contrast of the display. In the present invention, the post-spacers are formed in the ideal locations on the LCoS backplane by commonly employed semiconductor processes and without affecting the display quality. Additionally, the cell gap is effectively controlled so as to assure the proper operation of the LCD devices.

In contrast to the prior art, the present invention provides a method to form the post-spacers with fixed locations and a fixed height on the LCoS backplane by the photolithography and etching processes, so that the problems encountered in the prior art such as irregular distribution of the bead-spacers are effectively prevented during the fabrication of the micro-displays with the precisely-controlled cell gap. In addition, since the post-spacers and crossover pads, providing an internal circuit in a Liquid Crystal-on-Silicon backplane, are fabricating together, subsequent processes for soldering the electrode of the upper transparent conducting substrate onto the internal circuit board are omitted. Consequently, the yield rate is increased and the production cost is reduced both due to the improved manufacturing processes.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of fabricating a Liquid Crystal-on-Silicon (LCoS) backplane, the method comprising:

providing a silicon substrate;

forming a reflective mirror layer on the silicon substrate;

selectively etching the reflective mirror layer to define a crossover pad region, a pixel array region, and a bonding pad region, wherein the crossover pad region comprises a bottom pad made from the reflective mirror layer, the pixel array region comprises a plurality of reflective units made from the reflective mirror layer and a plurality of trenches formed between the reflective units, and the bonding pad region comprises at least one bonding pad made from the reflective mirror layer;

filling the trenches with a gap-filling material;

depositing a dielectric layer on the crossover pad region, the pixel array region and the bonding pad region;

forming a first photoresist layer on the dielectric layer, wherein the first photoresist layer comprising a plurality of openings within the crossover pad region;

performing an etching process to remove portions of exposed dielectric layer through the plurality of openings so as to form a plurality of crossover pad vias within the crossover pad region;

stripping the first photoresist layer;

forming a plurality of plugs in the plurality of the crossover pad vias;

forming a top pad over the crossover pad region, wherein the top pad being electrically coupled to the bottom pad via the plugs;

forming a second photoresist layer on the silicon substrate to define spacer patterns on the dielectric layer within the pixel array region; and etching the dielectric layer to form a plurality of spacers within the pixel array region.

2. The method of claim 1 wherein the reflective mirror layer comprises aluminum.

3. The method of claim 1 wherein a Reflectance Enhancement Passivation layer is further formed on the reflective mirror layer after the reflective mirror layer is formed, wherein the Reflectance Enhancement Passivation layer being used to counteract inhibiting effects caused by silicon substrate on reflectivity and improve the reflectance of the reflective mirror.

4. The method of claim 1 wherein a transparent conductive plate is further formed to cover the silicon substrate after forming the plurality of spacers, wherein the transparent conductive plate being electrically coupled with the top pad within the crossover pad region.

5. The method of claim 1 wherein the top pad comprises a top surface that is substantially higher than an uppermost surface of the plurality of spacers.

6. The method of claim 1 wherein a plurality of openings exposing a portion of the bonding pad are formed within the bonding pad region, simultaneously, during the formation of the spacers within the pixel array region.

7. A method of fabricating an LCoS backplane, the method comprising:

providing a silicon substrate;

forming a reflective mirror layer over the silicon substrate;

selectively etching the reflective mirror layer to define a pixel array region, wherein the pixel array region comprising a plurality of reflection units made from the reflective mirror layer and a plurality of trenches formed between the reflection units;

filling the trenches with a gap-filling material;

depositing a dielectric layer on the pixel array region;

forming a photoresist layer on the silicon substrate to define a spacer pattern on the dielectric layer within the pixel array region; and etching the dielectric layer to form a plurality of spacers within the pixel array region.

8. The method of claim 7 wherein a plurality of openings exposing a portion of the bonding pad are formed within the bonding pad region, simultaneously, during the formation of the spacers within the pixel array region.

9. The method of claim 7 wherein the reflective mirror layer comprises aluminum.

10. The method of claim 7 wherein a Reflectance Enhancement Passivation layer is further formed on the reflective mirror layer after the reflective mirror layer is formed, wherein the Reflectance Enhancement Passivation layer being used to counteract inhibiting effects caused by the silicon substrate on reflectivity and improve the reflectance of the reflective mirror.

11. The method of claim 7 wherein the dielectric layer is comprises silicon oxide.

* * * * *